(12) United States Patent
Brown et al.

(10) Patent No.: US 11,299,801 B2
(45) Date of Patent: *Apr. 12, 2022

(54) STRUCTURE AND METHOD TO FABRICATE HIGHLY REACTIVE PHYSICAL VAPOR DEPOSITION TARGET

(71) Applicant: INTERNATIONAL BUSINESS MACHINES CORPORATION, Armonk, NY (US)

(72) Inventors: Stephen L. Brown, Yorktown Heights, NY (US); Bruce B. Doris, Slingerlands, NY (US); Mark C. Reuter, Montrose, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 64 days.

This patent is subject to a terminal disclaimer.

(21) Appl. No.: 16/682,498

(22) Filed: Nov. 13, 2019

(65) Prior Publication Data

US 2020/0080191 A1 Mar. 12, 2020

Related U.S. Application Data

(63) Continuation of application No. 15/497,841, filed on Apr. 26, 2017, now Pat. No. 10,570,504.

(51) Int. Cl.
*C23C 14/34* (2006.01)
*C23C 14/08* (2006.01)
*H01J 37/34* (2006.01)
*C23C 14/06* (2006.01)

(52) U.S. Cl.
CPC .......... *C23C 14/3414* (2013.01); *C23C 14/06* (2013.01); *C23C 14/081* (2013.01); *H01J 37/3426* (2013.01); *H01J 37/3491* (2013.01)

(58) Field of Classification Search
None
See application file for complete search history.

(56) References Cited

U.S. PATENT DOCUMENTS

| | | | |
|---|---|---|---|
| 6,030,514 A * | 2/2000 | Dunlop | C23C 14/3414 134/1 |
| 6,767,617 B2 | 7/2004 | van der Kolk et al. | |
| 8,753,491 B2 * | 6/2014 | Yamazaki | C23C 14/3407 204/298.12 |
| 8,968,537 B2 | 3/2015 | Rasheed et al. | |
| 2005/0269200 A1 | 12/2005 | Burgess et al. | |
| 2008/0041720 A1 | 2/2008 | Kim et al. | |
| 2013/0048488 A1 | 2/2013 | Shufflebotham | |
| 2014/0138242 A1 * | 5/2014 | Neumann | C23C 14/3407 204/298.09 |

OTHER PUBLICATIONS

List of IBM Patents or Patent Applications Treated as Related dated Nov. 13, 2019, 2 pages.

* cited by examiner

*Primary Examiner* — Jason Berman
(74) *Attorney, Agent, or Firm* — Tutunjian & Bitetto, P.C.; Daniel Morris

(57) ABSTRACT

A physical vapor deposition (PVD) target that includes a body composed of material that is reactive with an oxygen containing atmosphere; and a non-reactive cap layer encapsulating at least a sputter surface of the body. The non-reactive cap layer is a barrier obstructing the diffusion of oxygen containing species to the body of the PVD target.

20 Claims, 3 Drawing Sheets

Providing a PVD target having a body composed of material that is reactive with an oxygen containing atmosphere and a non-reactive cap layer encapsulating at least a sputter surface of the body
3

Positioning the PVD target within a deposition chamber
4

Bombarding the non-reactive cap layer of the PVD target with first energetic particles to remove the non-reactive cap layer and expose a non-oxidized surface of the body of the PVD target
5

Bombarding the non-oxidized surface of the body of the PVD target with second energetic particles to deposit the material of the body of the PVD target onto a deposition surface of an article to be coated within the vacuum chamber
6

FIG. 3

STRUCTURE AND METHOD TO FABRICATE HIGHLY REACTIVE PHYSICAL VAPOR DEPOSITION TARGET

BACKGROUND

Technical Field

The methods and structures described herein relate to semiconductor processing and tools, and more particularly to a physical vapor deposition tool and method for use that provides protection for highly reactive source materials.

Related Art

Highly reactive physical vapor deposition (PVD) targets such as, e.g., Magnesium Oxide (MgO) and Lanthanum (La) can absorb water or oxidize very quickly during exposure to air. After initial installation of a new target, there is a significant burn-in time required to clean up water or oxidation on surfaces of the highly reactive target. The clean-up process is needed to prepare the target for deposition of high quality materials. The clean-up process is typically long in duration and can significantly reduce overall tool utilization. Without the proper clean-up process, it can be difficult to provide high purity low defect coatings. Additionally, without the proper clean-up process it can be difficult to provide for consistent manufacturing of devices including the coatings produced from highly reactive physical vapor deposition (PVD) targets. Further, deficiencies in coating purity can have negative impact on electrical devices including the coating. Structures, systems and methods are needed to reduce these clean up steps.

SUMMARY

In accordance with one embodiment, a physical vapor deposition (PVD) target is provided that includes a non-reactive cap layer, such as a metal oxide, e.g., titanium oxide ($TiO_2$) or aluminum oxide ($Al_2O_3$), atop a highly reactive source or target body, e.g., lanthanum or magnesium oxide (MgO). In some embodiments, the target comprises a body that is free of surface oxide, and a sacrificial non-reactive cap layer that is present atop the body of the physical vapor deposition (PVD) target, the sacrificial non-reactive cap layer being a metal oxide that protects the body from surface oxidation.

In one embodiment, a composition for the body of material that is reactive with an oxygen containing atmosphere and can include magnesium, magnesium oxide, lanthanum and combinations thereof. To avoid reaction of these material with the atmosphere, such as an oxygen containing atmosphere, a sacrificial non-reactive cap is formed on the body of the PVD target, which can be composed of titanium oxide ($TiO_2$), aluminum oxide ($Al_2O_3$), tantalum nitride (TaN), silicon oxide ($SiO_2$), chromium oxide, silicon nitride, tantalum oxide, and combinations thereof. These materials limit reaction of the aforementioned reactive materials with an atmosphere that includes oxygen and high moisture content, e.g., water content. By protecting the body of the target from being exposed to oxygen, the sacrificial non-reactive cap limits the absorption of oxygen and water by the body of the target. Once inserted into the deposition chamber, the sacrificial non-reactive cap is removed, in an oxygen free environment. In some embodiments, because the sacrificial non-reactive cap limited the absorption of oxygen and water by the body of the target, the clean-up process time needed to prepare the target for deposition of high quality materials is substantially reduced. In other embodiments, where metal containing sacrificial non-reactive cap compositions are not suitable, the composition for the non-reactive cap layer can be carbon, graphene, diamond like carbon (DLC), amorphous carbon and combinations thereof.

In another aspect, a method of sputtering is provided that includes forming a non-reactive cap layer on the body of a sputtering target prior to using the sputtering target to form a coating. In some embodiments, the method begins with providing a target body composed of material that is reactive with an oxygen containing atmosphere; and depositing a non-reactive cap layer encapsulating at least on a sputter surface of the body. The non-reactive cap layer is a barrier obstructing the diffusion of oxygen containing species to the body of the PVD target.

In some embodiments, in which the non-reactive cap layer includes a metal, such as aluminum or titanium, the non-reactive cap layer may be formed using a plating or sputtering method. In other embodiments, e.g., when the non-reactive cap layer includes silicon or carbon, the non-reactive cap layer can be formed using chemical vapor deposition. By protecting the body of the target from being exposed to oxygen, forming the sacrificial non-reactive cap on the body of the target limits the absorption of oxygen and water by the body of the target.

In another aspect, a deposition method is provided that in one embodiment includes providing a PVD target having a body for depositing a material having a composition that is reactive with an oxygen containing atmosphere and a non-reactive cap layer encapsulating at least a sputter surface of the body. The method may continue with positioning the PVD target within a deposition chamber, and bombarding the non-reactive cap layer of the PVD target with first energetic particles to remove the non-reactive cap layer and expose a non-oxidized surface of the body of the PVD target. Thereafter, the non-oxidized surface of the body of the PVD target may be bombarded with second energetic particles to deposit the material of the body of the PVD target onto a deposition surface of an article to be coated within the vacuum chamber. The coating can be formed on the deposition surface of the article without breaking the atmosphere of the vacuum chamber.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 3 is a flow chart describing one embodiment of a physical vapor deposition method using a PVD target having a sacrificial non-reactive cap layer.

DETAILED DESCRIPTION

Figure 1:
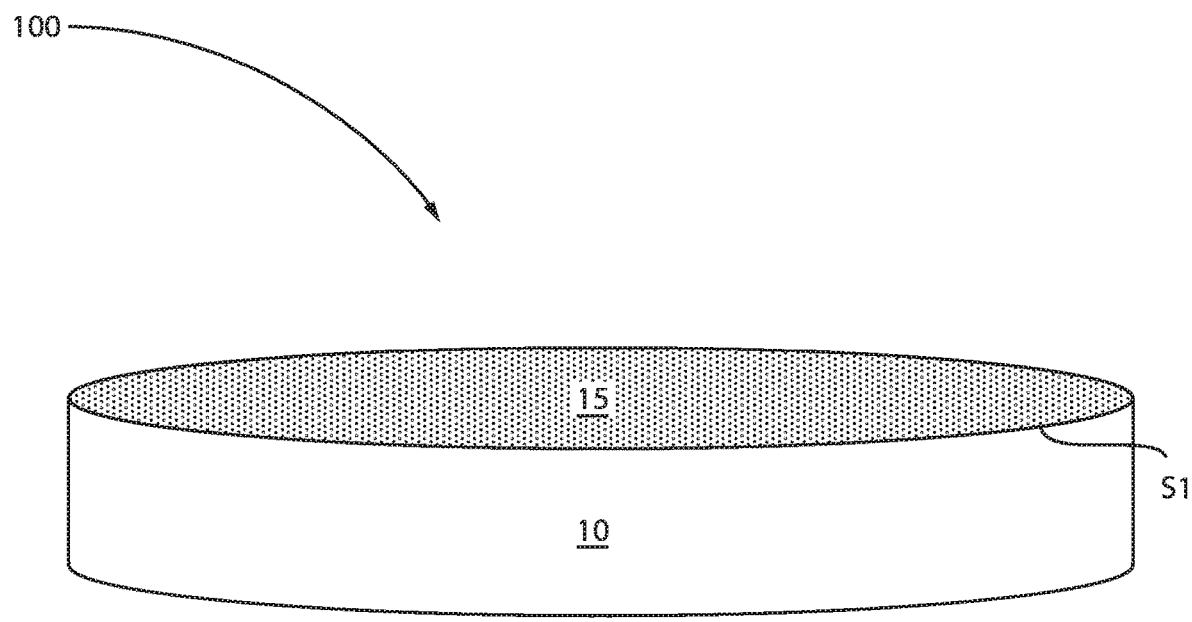
FIG. 1 is a side cross-sectional view of one embodiment of a physical vapor deposition (PVD) target that is composed of a body that is free of surface oxide, and a sacrificial non-reactive cap layer that is present atop the body of the physical vapor deposition (PVD) target, the sacrificial non-reactive cap layer being a metal oxide that protects the body from surface oxidation.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the physical vapor deposition (PVD) targets, and methods relating to the manufacture and use of the PVD targets described herein are directed toward eliminating the need for lengthy target clean up processes. For example, the PVD targets include a body of material, which is the composition that is to be deposited for the formation of a coating in accordance with a PVD process, which is highly reactive. Examples of highly reactive compositions for the body of the PVD target can include lanthanum or magnesium oxide (MgO). In some embodiments, the composition of the base material is highly reactive with oxygen and oxygen containing elements, such as water ($H_2O$). When the base material reacts with oxygen, the target purity is decreased. Therefore, prior to methods and structures described herein, to provide a suitable target for PVD sputter deposition, a significant burn-in time is required to clean up water or oxidation from the surfaces of the highly reactive target. The clean-up process is needed to prepare the target for deposition of high quality materials. The methods and structures described herein coat the reactive body of the PVD target with a non-reactive material. The non-reactive material protected the reactive composition of the target body from reacting with oxygen and oxygen containing elements, which reduces, and in some embodiments can eliminate, the need for lengthy burn in process steps to provide high quality coatings from the PVD targets composed of reactive materials. In some embodiments, the PVD targets and methods including PVD targets having the non-reactive capping layer are now described in more detail with reference to FIGS. 1-3.

FIG. 1 depicts one embodiment of a physical vapor deposition (PVD) target 100 that is composed of a body 10 that is free of surface oxide, and a sacrificial non-reactive cap layer 15 that is present atop the body 10 of the physical vapor deposition (PVD) target. In some embodiments, the sacrificial non-reactive cap layer 15 is a metal oxide that protects the body 10 from surface oxidation. More specifically, in some embodiments, the non-reactive cap layer 15 encapsulating at least a sputter surface S1 of the body 10. The non-reactive cap layer 15 is a barrier obstructing the diffusion of oxygen containing species to the body 10 of the PVD target 100.

In some embodiments, the composition for the body 10 of the PVD target 100 is of material that is reactive with an oxygen containing atmosphere, and is selected from the group consisting of magnesium (Mg), magnesium oxide ($MgO_2$), lanthanum (La) and combinations thereof. It is noted that the above compositions are provided for illustrative purposes and are not intended to be limiting. The term "reactive" when used to describe the body 10 of the PVD target means that the material reacts with an oxygen containing atmosphere, i.e., gas, liquid, and combination thereof, to form a chemical compound including an oxygen containing element and a metal containing element. In some embodiments, the term "reactive" denotes the formation of an oxide. It is noted that other compositions not specifically listed, but meeting the above description of reactive materials, are equally suitable for the body 10 of the PVD target 100.

In some embodiments, the non-reactive cap layer 15 is present on the sputtering surface S1 of the body 10 of the PVD target 100. In some embodiments, the non-reactive cap layer 15 is only present on the sputtering surface S1 of the body 10 of the PVD target 100. The non-reactive cap layer 15 may also be present on the sidewall surfaces of the body 10 of the PVD target 100, and may also be present entirely encapsulating the body 10 of the PVD target 100. The term "non-reactive" as used to describe the non-reactive cap layer 15 denotes that the material of the non-reactive cap layer 15 does not react with oxygen or oxygen containing elements, or that the material of the non-reactive cap layer 15 reacts with oxygen or oxygen containing elements at an oxidation rate providing a oxide that is self-limiting in thickness to not consume the base material of the PVD target.

One example of a material suitable for providing the non-reactive cap layer 15 and having a self-limiting thickness is aluminum and/or aluminum oxide. As will be described below, a non-reactive cap layer 15 that is composed of aluminum oxide ($Al_2O_3$) may be deposited as an aluminum (Al) metal layer, in which following deposition the aluminum reacts with oxygen from an oxygen containing atmosphere, which entirely consumes the aluminum layer acting as a barrier to further diffusion of oxygen past the aluminum oxide to the reactive material of the body 10 of the PVD target 100. In some embodiments, the non-reactive cap layer 15 may have a self-limiting thickness that can range from 1 nm to 30 nm. In some other embodiments, the non-reactive cap layer 15 may have a self-limiting thickness that can range from 10 nm to 20 nm.

Other examples of compositions for the non-reactive cap layer 15 can be selected from the group consisting of titanium oxide ($TiO_2$), titanium nitride (TiN), tantalum nitride (TaN), silicon oxide ($SiO_2$), chromium oxide, silicon nitride, tantalum oxide, and combinations thereof. In other embodiments, the composition for the non-reactive cap layer 15 may be carbon based. For example, the composition for the non-reactive cap layer 15 that includes carbon can be carbon, graphene, diamond like carbon (DLC), amorphous carbon and combinations thereof.

It is noted that the non-reactive cap layer 15 may be a single material layer, as depicted in FIG. 1. By single material layer, it is meant the non-reactive cap layer 15 has only one composition that is in direct contact with the body 10 of the PVD target 100. In other embodiments, the non-reactive cap layer 15 may be a multi-layered structure. For example, the non-reactive cap layer 15 may be composed of two or more layers of any of the aforementioned material compositions for the non-reactive cap layer 5 that can be sequentially formed on the body 10 of the PVD target 100. For example, the number of material layers in the non-reactive cap layer 15 may range from 1 layers to 15 layers. In other embodiments, the number of material layers in the non-reactive cap layer 15 may range from 2 layers to 5 layers.

The total thickness of the non-reactive cap layer 15 may range from 1 nm to 30 nm. It is noted that this is only one example of a range of thicknesses that is suitable for describing the non-reactive cap layer 15. In some other examples, the total thickness of the non-reactive cap layer 15 may be equal to 1 nm, 2 nm, 3 nm, 4 nm, 5 nm, 6 nm, 7 nm, 8 nm, 9 nm, 10 nm, 15 nm, 20 nm, 21 nm, 22 nm, 23 nm, 24 nm, 25 nm, 26 nm, 27 nm, 28 nm, 29 nm and 30 nm, as well as any range of thicknesses having a lower level selected from one of the aforementioned examples and an upper level selected from one of the aforementioned examples.

In some embodiments, the thickness of the non-reactive cap layer 15 is conformal on said sidewalls and said upper surface S1 of said body. The term "conformal" denotes a layer having a thickness that does not deviate from greater than or less than 30% of an average value for the thickness of the layer. For example, the thickness of the non-reactive cap layer 15 may be conformal along an entirety of the upper surface S1 of the body 10.

In some embodiments, the thickness of the non-reactive cap layer 15 can be selected to provide that the non-reactive cap layer 15 can be sputtered from the body 10 of the reactive material to expose a high purity surface of the reactive material of the body 10 at the sputter surface in a manner that eliminates the need for lengthy target clean up. In some examples, high purity may refer to the presence of a non-oxidized surface. For example, the sputter surface S1 may be pure magnesium (Mg), pure lanthanum (La) and combinations thereof. High purity can be a purity of 99 at. % or greater for a reactive material of the body 10. For example, the sputter surface S1 can be 99 at. % lanthanum (La) or greater. In some instances, the sputter surface S1 can be 100 at. % lanthanum (La). The sputter surface S1 may also be 100 at. % magnesium oxide (MgO) following removal of the non-reactive cap layer 15.

Figure 2:
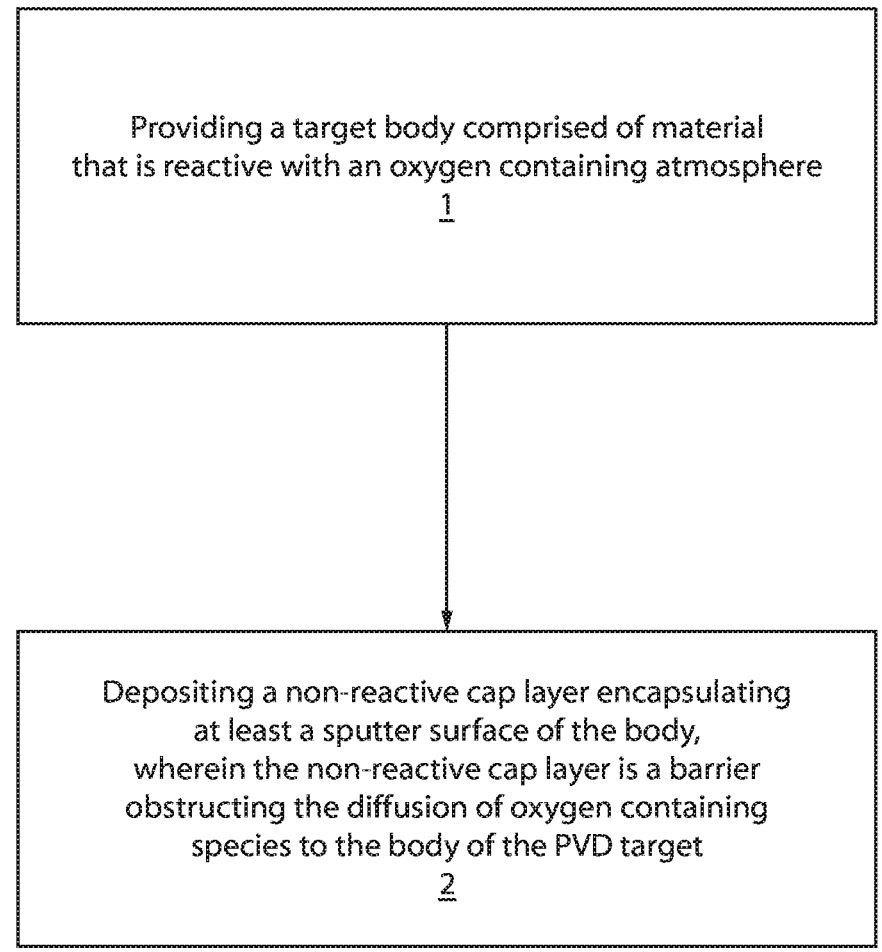
FIG. 2 is a flow chart describing one embodiment of a method for forming a PVD target having a sacrificial non-reactive cap layer.

FIG. 2 is flow chart describing one embodiment of a method for forming a PVD target having a sacrificial non-reactive cap layer 15. With reference to FIGS. 1 and 2, the methods described with reference to FIG. 2 may include fabricating the body 10 of the PVD target 100 by fusion via melting or by hot pressing, e.g., hot pressing of powder. In some embodiments, bonding layers are deposited on the backside, i.e., the side opposite the supper surface S1, to promote adhesion and prevent diffusion of the bonding material into the target. The sacrificial non-reactive cap layer 15 may be formed before or after the deposition steps describing the aforementioned bonding material. As will be described in greater detail below, the sacrificial non-reactive cap layer 15 may be deposited using plating, electroplating, electroless plating, physical vapor deposition, sputtering, chemical vapor deposition, thermal evaporation, sublimation, electron beam evaporation, molecular epitaxial beam (MBE) deposition, brushing, curtain coating or combinations thereof. The details of some embodiments for methods of forming the PVD target 100 are now described in greater detail.

In some embodiments, the method of forming the PVD target 100 may begin with providing a target body 10 comprised of material that is reactive with an oxygen containing atmosphere at step 1 of the process flow described in FIG. 2.

In one example, the target body 10 may be composed of magnesium oxide (MgO) that is formed by hot pressing. Hot pressing is a high-pressure, low-strain-rate powder metallurgy process for forming of a powder or powder compact at a temperature high enough to induce sintering. For example, the body 10 of magnesium oxide (MgO) for the target 100 may be formed from a powder comprising, as a primary component, an MgO (magnesium oxide) powder having an average particle size of 0.2 µm, which can be dispersed in and mixed with a methanol solvent under mixing conditions to obtain a MgO slurry.

Thereafter, an alcohol-based binder can be added to the MgO slurry, and the mixture can be granulated in a nitrogen atmosphere using a closed-cycle spray dryer. The obtained granulated powder is shaped using die pressing. In some embodiments, each of the compacts can be treated by pressure less sintering under an ambient atmosphere at a temperature of 1600-1700 K, and/or the compacts can be subjected to hot-press (HP) sintering under an argon atmosphere at a temperature of 1700-1800k. The hot press sintering steps can include applying a pressure of 15 MPa to 25 MPa. In some embodiments, the compacts may be subjected to a hot isostatic press (HIP) sintering step under an argon atmosphere in a temperature range of 1600 to 1800 K at a pressure ranging from 75 MPa to 125 MPa. It is noted that some of the aforementioned pressing steps can be optional for some embodiments of the methods described herein.

Following pressing, each of the sintered bodies can be subjected to an oxidation treatment under an oxidation atmosphere containing 15 volume % to 20 volume % of oxygen, at a temperature of ranging from 1800 K to 1850 K for a time period ranging from 1 hour to 10 hours, to oxidize a portion of the sintered body to provide a body 10 for a PVD target 100 composed of magnesium oxide (MgO).

In another embodiment, the target body 10 may be composed of lanthanum (La). In one example, in order to produce the lanthanum body 10 for a PVD target 100 for sputtering, lanthanum is melted and cast (solidified) to produce an ingot. Lanthanum having a purity of 99.9% can used as the lanthanum raw material. In some embodiments, the raw material can be melted with an electron beam (EB) melting furnace of 70 kW at vacuum. Following casting, the obtained ingot can be forged to a rough target body 10 geometry by knead forging at a temperature ranging from 300° C. to 500° C. In some examples, once the rough target shape has been provided, the structure is further subjected to heat treatments at 170° C. to 190° C. for a time period ranging from ½ hour to 2 hours to obtain a recrystallized structure. In some embodiments, the structure is subject to machining to obtain a disk-shaped target for the target body 10 of the PVD target 100.

It is noted that the above methods, i.e., pressing of metallic powder, and melting/forging, that are used to form the target body 10 are provided for illustrative purposes only, and are not intended to limit the present disclosure. Any similar method for forming a target body of reactive materials is suitable for use with the methods and structures described herein.

Following formation of the target body 10, the prepared target is bonded with a backing plate. In one example, the target body 10 is bonded with a copper (so-called OFC "oxygen-free copper") backing plate based on diffusion bonding (DB).

Referring to step 2 of FIG. 2, the method may continue with depositing a non-reactive cap layer 15 encapsulating at least a sputter surface S1 of the target body 10. The non-reactive cap layer 15 is a barrier obstructing the diffusion of oxygen containing species to the target body 10 of the PVD target 100.

In some embodiments, prior to forming the non-reactive cap layer 15, any surface oxide or other surface layer formed from reaction of the reactive material of the target body 10 with the atmosphere may be removed. For example, surface oxides or surface layers formed from reaction with the atmosphere can be removed using etch process and cleaning process. For example, plasma gas etch can be used to remove the aforementioned surface oxide layers. In some embodiments, to avoid reaction of the target body 10 of reactive material with the atmosphere the target body 10 may be maintained in an oxygen free environment, e.g., in a vacuum.

In one embodiment, depositing the non-reactive cap layer 15 includes depositing a metal selected from the group consisting of aluminum, titanium, chromium, tantalum, and combinations thereof, and then oxidizing the metal to provide to non-reactive cap layer 15 having a composition selected from the group consisting of titanium oxide ($TiO_2$), aluminum oxide ($Al_2O_3$), chromium oxide, tantalum oxide, and combinations thereof. The metal may be deposited using plating, electroplating and sputtering. Electroplating is a process that uses electrical current to control the flow of charged particles, such as metal cations and anions, so that they form a coherent metal coating on an electrode, which may provide the deposition surface. Electroless plating, also known as chemical or auto-catalytic plating, is a non-galvanic plating method that involves several simultaneous reactions in an liquid solution, e.g., aqueous solution, which occur without the use of external electrical power. It is mainly different from electroplating by not using external electrical power. As used herein, "sputtering" means a method of depositing a film of material on a semiconductor surface. A target of the desired material, i.e., source, is bombarded with particles, e.g., ions, which knock atoms from the target, and the dislodged target material deposits on the deposition surface. Examples of sputtering techniques suitable for depositing the metallic adhesion layer 16, but are not limited to, DC diode sputtering ("also referred to as DC sputtering"), radio frequency (RF) sputtering, magnetron sputtering, and ionized metal plasma (IMP) sputtering. In other examples, the metal may be deposited by evaporation, and chemical vapor deposition. In one example, in which the metal being deposited is composed of titanium (Ti), the metal may be deposited using titanium sublimation.

When the metal being deposition is a highly reactive material, such as aluminum or titanium, the speed at which the metal reacts with the atmosphere can form a metal oxide having a self-limiting thickness. For example, aluminum (Al) reaction with an oxygen containing atmosphere will from aluminum oxide ($Al_2O_3$). In another example, titanium (Ti) reaction with an oxygen containing atmosphere will from aluminum oxide ($TiO_2$). In some embodiments, the oxygen introduced to the atmosphere may result from a break in vacuum of the deposition chamber, in which an oxygen containing ambient atmosphere may be introduced to the deposition chamber including the deposited metal, hence converting it to a self-limiting metal oxide. As noted above, the self-limiting thickness may range from 1 nm to 30 nm.

In other embodiments, an oxygen containing gas may be introduced to the deposition chamber containing the metal that is converted to a metal oxide to provide the non-reactive coating 15. These describe only some examples of the methods and structures provided herein for producing the non-reactive cap layer 15.

In other embodiments, the non-reactive cap layer 15 has composition selected from the group consisting of silicon oxide, titanium oxide ($TiO_2$), aluminum oxide ($Al_2O_3$), chromium oxide, tantalum oxide, and combinations thereof, in which the non-reactive cap layer 15 is deposited using chemical vapor deposition (CVD). In these embodiments, the non-reactive cap layer 15 is deposited directly as a metal oxide. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for depositing the non-reactive cap layer 15 include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

In some other embodiments, the non-reactive cap layer 15 may be composed of a carbon based composition. For example, the non-reactive cap layer 15 may be carbon, graphene, diamond like carbon (DLC), amorphous carbon and combinations thereof, in which the non-reactive cap layer 15 is deposited by chemical vapor deposition (CVD). Any of the aforementioned examples of chemical vapor deposition (CVD) that have been described above are suitable for describing the deposition step for forming the non-reactive cap layer 15 of a carbon based material.

As noted above, the deposition process continues until the non-reactive cap layer 15 is present on at least the sputter surface S1 of the target body at a thickness ranging from 1 nm to 30 nm.

The PVD target 100 that is formed using the method described with reference to FIG. 2 has the advantage of including a non-reactive cap layer 15 that obstructs the oxidation and absorption of oxygen containing species, such as water ($H_2O$), by the target body 10. By providing a PVD target 100 having the non-reactive cap layer 15, the method provided herein can substantially eliminate the requirements of a significant burn-in time required to clean up water or oxidation on surfaces of prior PVD targets having a body of a highly reactive material. The clean-up process is typically long in duration and can significantly reduce overall tool utilization. By eliminating the clean-up process time, the methods and structures described herein can provide for increased utilization of PVD deposition tools and increased throughput of structures coated by PVD deposition tools using the PVD targets 100 that are provided by the methods and structures described herein.

FIG. 3 is a flow chart describing one embodiment of a physical vapor deposition method using a PVD target 100 having a sacrificial non-reactive cap layer 15, as depicted in FIG. 1. The method may begin with step 3 of providing a PVD target 100 having a body 10 composed of a material that is reactive with an oxygen containing atmosphere and a non-reactive cap layer 15 encapsulating at least a sputter surface S1 of the body 10. Further details on the PVD target 100 having the non-reactive cap layer 15 have been provided in the above description referring to FIG. 1. Further details on manufacturing the PVD target 100 having the non-reactive cap layer 15 have been provided in the above description referring to FIG. 2.

The physical vapor deposition method may continue with step 4 with positioning the PVD target 100 within a deposition chamber of a PVD deposition apparatus. PVD is characterized by a process in which the material goes from a condensed phase to a vapor phase and then back to a thin film condensed phase. The PVD processes can include sputtering and evaporation. The PVD deposition apparatus may be a sputtering device, such as a DC diode sputtering ("also referred to as DC sputtering") device, radio frequency (RF) sputtering device, magnetron sputtering device, and ionized metal plasma (IMP) sputtering device.

The PVD deposition apparatus can perform a plurality of vacuum deposition processes which can be used to form thin films and coatings. PVD can be employed for semiconductor device fabrication, solar panel fabrication, thin films for packaging, tool coatings, etc.

The PVD deposition apparatus may include a vacuum chamber where a source material, i.e., PVD target 100, is provided for PVD processing (e.g., sputtering or evaporation). The vacuum chamber includes a reduced pressure during operation realized by a tightly sealed system with input gas supply lines, output gas lines and a vacuum pump(s).

The source material (PVD target 100) is mounted to face a substrate or workpiece onto which the material from the source material is deposited. For example, the PVD target 100 may be positioned so that the sputter surface S1 is positioned towards the deposition surface of the article to be coated.

DC, pulsed DC, AC and RF power supplies may be used, depending upon target material, if reactive sputtering is desired and other factors. A permanent magnet structure is located behind a target serving as a deposition source. Plasma confinement on the target surface is achieved by locating a permanent magnet structure behind the target surface. The resulting magnetic field forms a closed-loop annular path acting as an electron trap that reshapes the trajectories of the secondary electrons ejected from target into a cycloidal path, greatly increasing the probability of ionization of the sputtering gas within the confinement zone. Inert gases, specifically argon, are usually employed as the sputtering gas because they tend not to react with the target material, i.e., PVD target 100, or combine with any process gases and because they produce higher sputtering and deposition rates due to their high molecular weight.

While the PVD target 100 is in the vacuum chamber, positively charged argon ions from the plasma are accelerated toward the negatively biased target (cathode), i.e., PVD target 100, resulting in material being sputtered from the target surface. In some embodiments, the use of an ion beam source or combined ion beam-magnetron sputtering source allows the benefits of high target utilization, i.e., high utilization of the PVD target 100, minimized insulating film growth on the target surface and simultaneous, independent control of bombardment of the growing film.

Referring to FIG. 3, the PVD deposition method includes bombarding the non-reactive cap layer 15 of the PVD target 100 with first energetic particles to remove the non-reactive cap layer 15 and expose a non-oxidized surface of the body 10 of the PVD target 100 at step 5. Removing the non-reactive cap layer 15 may be referred to as a burn in process.

Typically, this step is conducted in the vacuum chamber of the PVD deposition apparatus in the absence of oxygen. Because, the non-reactive cap layer 15 protects the body 10 of the PVD target 100, which is composed of reactive material, such as lanthanum or magnesium oxide, from the absorption of oxygen containing species, such as water, and obstructs the formation of surface oxides on the sputter surface S1 of the body 10 of the PVD target; the methods and structures described herein substantially eliminate the need for the significant burn-in time required to clean up water or oxidation from surfaces of prior PVD targets having a body of a highly reactive material. Further, removing the non-reactive cap layer 15 in a substantially oxygen free atmosphere, i.e., the vacuum provided by the vacuum chamber, the method provided a sputtering surface S1 that is pure and free of oxide or absorbed water. In some embodiments, the sputter rate for the material of the non-reactive cap layer 15 is greater than the sputter rate of the material for the material of the body 10. Further, the thickness of the non-reactive cap layer 15 can be not much greater than the requirements of a continuous film. Therefore, in some embodiments, the main material of the body 10 of the PVD target 100 will continued to be sputtered from the target during the burn in process. In some embodiments, during the burn in process, the material of the non-reactive cap layer 15 may be sputtered from the PVD target 100 onto a deposition surface, which can be a dummy wafer or a wafer to be coated, and will be covered by the main target material, i.e., the material of the body 10 of the PVD target 100. In some embodiments, the PVD deposition apparatus includes shutters that can be closed to maintain the PVD target 100 in an oxygen free environment after the non-reactive cap layer 15 is removed. If shutters can't be closed during this cycle, dummy wafers can be used and discarded afterward. Then wafers that are to be coated with high purity material from the body of the PVD target 100 can be introduced to the chamber, as step 6.

Referring to FIG. 3, at step 6, the method may continue with bombarding the non-oxidized surface, i.e., sputter surface S1, of the body 10 of the PVD target 100 with second energetic particles to deposit the material of the body 10 from the PVD target onto a deposition surface of an article to be coated within the vacuum chamber, e.g., wafer. During step 6, the non-reactive cap layer 15 has been removed; and the sputter surface S1 is high purity surface that is free of oxide, e.g., is free of absorbed oxygen and water. This can provide a high purity coating on the article being coated from the body 10 of the PVD target 100, which may be composed of a reactive material, such as lanthanum.

Although, the article being coated is described as a wafer, the method is not limited to only this type of product. Other articles that can be coated can have applications for aerospace, automotive, surgical/medical, dies and molds for all manner of material processing, cutting tools, firearms, optics, watches, thin films and coated metals.

It is to be understood that aspects of the present invention will be described in terms of a given illustrative architecture; however, other architectures, structures, substrate materials and process features and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The deposition tool is also well suited for magnetic devices that utilize MgO dielectrics like MRAM for example and magnetic inductors. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Having described preferred embodiments for an improved structure and method to fabricate highly reactive physical vapor deposition targets (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A target comprising:
   a body comprised of a deposition material; and
   a non-reactive cap layer encapsulating at least a portion of the body, wherein a composition for the non-reactive cap layer is selected from the group consisting of titanium oxide ($TiO_2$), tantalum nitride (TaN), chromium oxide, tantalum oxide, carbon, graphene, diamond like carbon (DLC), amorphous carbon and combinations thereof.

2. The target of claim 1, wherein a composition for the deposition body is selected from the group consisting of magnesium, magnesium oxide, lanthanum and combinations thereof.

3. The target of claim 1, wherein the non-reactive cap layer has a thickness ranging from 1 nm to 30 nm.

4. The target of claim 3, wherein the non-reactive cap layer is present on sidewalls of the body as well as an upper surface of said body.

5. The target of claim 4, wherein thickness of the non-reactive cap layer is conformal on said sidewalls and said upper surface of said body.

6. A method for forming a target comprising:
   providing a target body comprised of deposition material; and
   depositing a non-reactive cap layer encapsulating at least a surface of the body, wherein a composition for the non-reactive cap layer is selected from the group consisting of titanium oxide ($TiO_2$), tantalum nitride (TaN), chromium oxide, tantalum oxide, carbon, graphene, diamond like carbon (DLC), amorphous carbon and combinations thereof.

7. The method of claim 6, wherein a composition for the deposition body is selected from the group consisting of magnesium, magnesium oxide, lanthanum and combinations thereof.

8. The method of claim 7, wherein said depositing the non-reactive cap layer comprises depositing a metal selected from the group consisting of aluminum, titanium, chromium, tantalum, and combinations thereof; and oxidizing the metal to provide said non-reactive cap layer having a composition selected from the group consisting of titanium oxide ($TiO_2$), aluminum oxide ($Al_2O_3$), chromium oxide, tantalum oxide, and combinations thereof.

9. The method of claim 8, wherein the metal layer for depositing the non-reactive cap layer is formed by electroplating, plating, chemical vapor deposition, physical vapor deposition, sublimation or a combination thereof.

10. The method of claim 9, wherein said oxidizing is self-limiting in thickness.

11. The method of claim 10, wherein the thickness ranges from 1 nm to 30 nm.

12. The method of claim 6, wherein the non-reactive cap layer is deposited using chemical vapor deposition.

13. A deposition method comprising:
providing a target having a body composed of a deposition material and a non-reactive cap layer encapsulating the body, wherein a composition for the non-reactive cap layer is selected from the group consisting of titanium oxide ($TiO_2$), tantalum nitride (TaN), chromium oxide, tantalum oxide, carbon, graphene, diamond like carbon (DLC), amorphous carbon and combinations thereof, and combinations thereof;
positioning the target within a deposition chamber;
exposing a surface of the body of the target underlying the non-reactive cap layer; and
depositing the deposition material of the body of the target onto a deposition surface of an article to be coated.

14. The method of claim 13, wherein a sequence of said steps of said exposing a surface of the body of the target underlying the non-reactive cap layer and said depositing the deposition material of the body of the target onto a deposition surface of an article is performed without breaking the atmosphere of the deposition chamber.

15. The deposition method of claim 13, wherein a composition for the deposition material is selected from the group consisting of magnesium, magnesium oxide, lanthanum and combinations thereof.

16. The deposition method of claim 13, wherein the non-reactive cap layer has a thickness ranging from 1 nm to 30 nm.

17. The deposition method of claim 16, wherein the non-reactive cap layer has a conformal thickness.

18. The deposition method of claim 17, wherein the non-reactive cap layer is present on an upper surface of said body of said target.

19. The deposition method of claim 18, wherein the non-reactive cap layer is present on a sidewall surface of said body of said target.

20. The deposition method of claim 19, wherein the non-reactive cap layer is present on a base surface of said body of said target.

* * * * *